United States Patent [19]

Bernards et al.

[11] Patent Number: 4,932,518

[45] Date of Patent: Jun. 12, 1990

[54] METHOD AND APPARATUS FOR DETERMINING THROWING POWER OF AN ELECTROPLATING SOLUTION

[75] Inventors: Roger F. Bernards, Wellesley; Gordon Fisher, Sudbury; Wade Sonnenberg, Foxboro, all of Mass.

[73] Assignee: Shipley Company Inc., Newton, Mass.

[21] Appl. No.: 438,021

[22] Filed: Nov. 20, 1989

Related U.S. Application Data

[62] Division of Ser. No. 235,051, Aug. 23, 1988, Pat. No. 4,897,165.

[51] Int. Cl.$^5$ .................. G01N 27/00; G01N 27/28
[52] U.S. Cl. .................. 204/52.1; 204/45.1; 204/434; 204/153.1
[58] Field of Search ............. 204/1 T, 434, 45.1, 204/52.1

[56] References Cited

U.S. PATENT DOCUMENTS 3,121,053  2/1964  Hull et al. ..................... 204/434
3,128,371  4/1964  Spaulding et al. ............. 204/1 T X
4,102,770  7/1978  Moriarty et al. ............... 204/434
4,487,681  12/1984  Cordes ............................ 204/434

FOREIGN PATENT DOCUMENTS 787494  12/1980  U.S.S.R. .

OTHER PUBLICATIONS

D. R. Turner, Plating and Surface Finishing, pp. 32–35, Jul. 1979.

Primary Examiner—G. L. Kaplan
Attorney, Agent, or Firm—Robert L. Goldberg

[57] ABSTRACT

A composition for electroplating copper onto a conductive surface comprising a solution soluble copper salt and an acid electrolyte, said copper salt being present in a concentration of from about 1 to 10 grams per liter of solution and said acid being present in a concentration whereby the acid to copper ratio preferably varies between about 30 to 1 and 50 to 1. The composition is especially useful for the plating of walls of cylindrical openings having a ratio of height to diameter of at least 10 to 1 and a length of at least 0.100 inches.

10 Claims, 3 Drawing Sheets

METHOD AND APPARATUS FOR DETERMINING THROWING POWER OF AN ELECTROPLATING SOLUTION

This is a division of application Ser. No. 07/235,051 filed on Aug. 23, 1988 and now Pat. No. 4,897,165.

BACKGROUND OF THE INVENTION

1. Introduction

This invention relates to an electrolyte plating solution, a process for use of said solution, and to articles formed using the process and solution. In particular, the invention relates to uniformly depositing a coating of electrolytic metal on the walls of a cylindrical opening having a ratio of length to diameter greater than ten to one and a length equal to at least 0.100 inches.

2. Description of the Prior Art

Methods for electroplating articles with metal coatings are well known in the art. Such methods involve passing a current between two electrodes in a plating solution where one of the electrodes is the article to be plated. Using an acid copper plating solution for purposes of illustration, a plating solution would comprise (1) dissolved copper (cupric ions), usually copper sulfate, (2) an acid electrolyte such as sulfuric acid in an amount sufficient to impart conductivity to the bath, and (3) proprietary additives to improve efficiency of the plating reaction and the quality of the metal deposit. Such additives include surfactants, brighteners, levelers, suppressants, etc.

Electrolytic copper plating solutions are used for many industrial applications. For example, they are used in the automotive industry as base layers for subsequently applied decorative and corrosion protective coatings. They are also used in the electronics industry, particularly for the fabrication of printed circuit boards. For circuit fabrication, copper is electroplated over selected portions of the surface of a printed circuit board and onto the walls of through-holes passing between the surfaces of the circuit board base material. The walls of a through-hole are metalized to provide conductivity between circuit layers on each surface of the board.

Early efforts to make circuit boards used electrolytic copper plating solutions developed for decorative plating. However as printed circuit boards became more complex and as industry standards became more rigorous, solutions used for decorative plating were found to be inadequate for circuit board fabrication. A serious problem encountered using electrolytic copper plating solutions involved coatings of uneven thickness on the walls of the through hole with the deposits thicker at the top and bottom of the holes and thinner at the center, a condition known in the art as "dog boning". The thin deposit at the center of the through hole may lead to circuit defects and board rejection.

Dog boning is caused by a voltage drop between the top surface of the hole and the center of the hole. This potential drop is a function of current density, a ratio of the length of the hole to its diameter (aspect ratio) and board thickness. As the aspect ratio and the thickness of the board increase, dog boning becomes more severe due to a voltage drop between the surface of the board and the center of the through hole. This voltage drop is caused by a combination of factors including solution resistance; a difference in surface to hole overpotential due to mass transfer—i.e., a difference in the flow of solution through the hole compared to the movement of the solution over the surface of the board; and a charge transfer difference as a consequence of copper concentration in the hole, the copper to hydrogen ratio in the hole and the concentration of additives in the hole.

The circuit board industry continuously seeks greater circuit densification. To increase density, the industry has resorted to multilayer circuits with through holes or interconnections passing through multiple layers. Multilayer circuit fabrication results in an overall increase in the thickness of the board and a concomitant increase in the length of an interconnection passing through the board. This means that increased circuit densification results in increased aspect ratios and hole length and an increase in the severity of the dog boning problem. For high density boards, aspect ratios typically exceed ten to one.

The prior art, exemplified by Mayer and Barbien, "Characteristics of Acid Copper Sulfate Deposits for Printed Wiring Board Applications," *Plating and Surface Finishing*, pp. 46 to 49, March, 1981; Malak, "Acid Copper Plating of Printed Circuits," *Products Finishing*, pp. 38 to 44, March, 1981; and Amadi, "Plating High Aspect Ratio Multilayer Boards," *PC FAB*, pp. 85 to 94, October 1987, all incorporated herein by reference, suggest that increasing the acid to metal ion ratio of an electrolytic plating solution improves plating solution throwing power and deposit distribution. The prior art teaches that the ratio may be altered, for example, by (1) increasing acid concentration while holding metal ion concentration constant or (2) by decreasing metal ion concentration while holding acid concentration constant. However, the prior art also teaches that (1) increased acid concentration may result in anode polarization with cessation of the plating reaction, and (2) decreased metal concentration resulting in exacerbation of the dog boning problem.

SUMMARY OF THE INVENTION

The subject invention is directed to a process of metal plating, a plating solution, a control device and articles formed using the aforesaid and has as its object, the elimination of dog boning in the formation of circuit boards having through-holes with an aspect ratio of at least ten to one and through hole interconnection lengths of at least 0.100 inches.

The invention is based upon the discovery that an electrolytic copper plating solution having a copper metal content varying between 1.0 and 10.0 grams per liter, preferably 3 and 8 grams per liter, and a hydrogen ion content (expressed as sulfuric acid) in an amount such that the acid to copper weight ratio varies within a range having an upper limit defined by the equation:

$$R = 67 - 2.7 [X]$$

and a lower limit defined by the equation:

$$R = 35 - 1.3 [X];$$

where R is the weight ratio of hydrogen ion to copper metal and X is the weight of copper metal in solution. The hydrogen ion content in the above equations is expressed as sulfuric acid since this is the acid of choice in the industry for electrolytic copper plating solutions. A preferred ratio of hydrogen ion, again expressed as sulfuric acid, to copper metal in accordance with the above equations varies between from 30:1 to 70:1 and a most preferred ratio varies between 40:1 and 60:1.

In a preferred embodiment of the invention, the copper plating solution also contains a novel surfactant that is a high molecular weight polyethylene oxide. The surfactant significantly improves throwing power within the interconnect or through-hole opening.

Solutions having copper and acid concentrations as defined above are capable of plating openings having an aspect ratio greater than ten to one and a length in excess of 0.100 inches with a uniform metal deposit throughout the length of the opening. It is also a discovery of this invention that the deposit from such a solution possess increased ductility, a desirable property for circuit manufacture.

DESCRIPTION OF THE PREFERRED EMBODIMENTS

Figure 1:
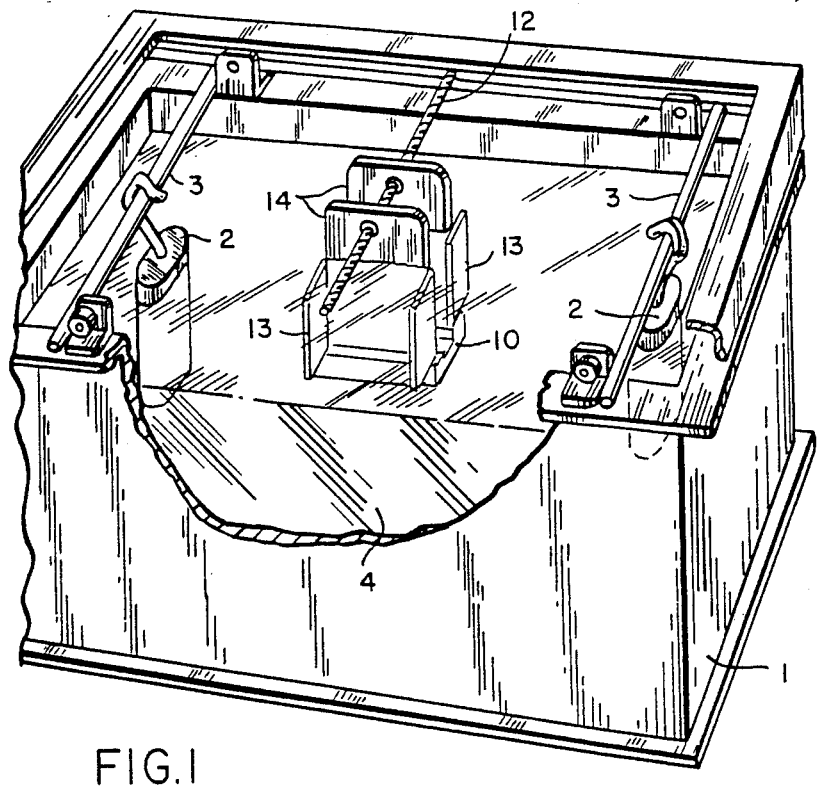
FIG. 1 is a diagrammatic representation of a plating tank containing a channel cell electrode used to measure metal deposit uniformity in a replicated interconnect.

The electrolytic copper plating solution of the subject invention is useful for plating copper over a variety of surfaces for a variety of commercial uses. However, the solutions are especially useful for the manufacture of double sided and multilayer printed circuit boards requiring metalized through hole or interconnection walls, especially high density printed circuit boards. For this reason, the description which follows is directed to printed circuit fabrication using the solutions of this invention.

In the fabrication of printed circuits, the starting material is typically a copper clad plastic—i.e., a copper clad epoxy panel. Using subtractive techniques for the fabrication of the board for purposes of illustration, prior to formation of a circuit, conductive through-holes are formed in the board by drilling and metallization. Processes for formation of conductive through-holes are well known in the art and described in numerous publications including U.S. Pat. No. 4,515,829 incorporated herein by reference. Electroless plating procedures are used to form a first metallic coating over the through hole wall and electrolytic copper deposition is then used to enhance the thickness of the deposit. Processes for electrolessly plating through-holes are not part of this invention.

The next step in the process comprises electroplating copper onto the electrolessly coated hole walls using the electroplating solution of this invention. An electrolytic copper plating solution in accordance with the invention has a composition as follows:

| copper ions | 1.0 to 10.0 gm/l |
| acid | sufficient for acid to copper ratio defined by above equations |
| water | to 1 liter of solution. |

A preferred electrolytic copper plating solution in accordance with the invention has the following composition:

| copper ions | 3.0 to 8.0 gm/l |
| sulfuric acid | sufficient for acid to copper ratio of 40:1 to 60:1 |
| chloride ions | 20 to 100 mg/l |
| surfactant | 25 to 1000 ppm |
| water | to 1 liter |

For the ratio defining the acid to copper concentrations, greater latitude is possible at a lower copper content. As the copper (metal) content increases up to a maximum of 10.0 grams per liter of solution, the maximum ratio of acid to copper decreases.

In addition to the components identified above, as is known in the art, other additives may be used in the plating solution such as brighteners, exaltants, leveling agents, suppressors, etc. Such materials are well known in the art and disclosed in numerous patents including U.S. Pat. Nos. 4,347,108; 4,673,469 and 4,683,036 incorporated herein by reference.

The surfactant is a particularly useful additive in the bath of the subject invention. Preferred surfactants are high molecular weight polyethers. Examples of such ether-containing wetting agents are those having the general formula

$$R\text{—}O\text{—}(CH_2CH_2O)_nH$$

where R is an aryl or alkyl group containing from about two to 20 carbon atoms and n is an integer between 10 and 100,000. Preferably, R is ethylene and n is greater than 12,000. Electroplating solutions containing surfactants conforming to the above general formula and having molecular weights in excess of 500,000 are believed to be new compositions of matter.

Though lesser preferred, amine, alkanol amines, amides and polyglycol-type wetting agents known in the art are also useful surfactants. Carbowax-type wetting agents, which are polyethylene glycols having different molecular weights, are suitable. An exemplary Carbowax is Carbowax No. 1000 having a molecular weight range of from about 950 to 1,050 and containing from 20 to 24 ethoxy units per molecule. Another suitable Carbowax is Carbowax No. 4000 with a molecular weight range of from about 3000 to 3700 which contains from 68 to 85 ethoxy units per molecule.

The above surfactants are preferably added to the plating solution of the invention in an amount varying between about 1 and 2500 parts per million parts of solution and more preferably, in an amount varying between about 500 and 1500 parts per million parts of solution. A metal deposit over a through hole wall is more uniform in thickness throughout the length of the hole when the plating solution contains a member of the above class of surfactants compared to a solution free of such an additive.

In accordance with the invention, greater uniformity in hole wall plating is believed to involve overpotential at the cathode. The overpotential comprises two basic components—i.e., charge transfer and mass transfer overpotential. The charge transfer overpotential is the amount of energy required to overcome the reduction of copper$^{+2}$ to copper metal. The extent of the overpotential is governed primarily by the surfactant, the copper concentration and the hydrogen to copper ratio.

It is known that surfactants of the type contemplated herein suppress plating rate at a given potential. Stated otherwise, the presence of the surfactant in solution increases the charge transfer overpotential. The extent of the overpotential shift is related to the type of surfactant and its molecular weight. Greater energy is required to overcome the absorbed layer of surfactant at the cathode surface. The thickness of the surfactant layer, at a given temperature, will dictate the amount of suppression. It is believed that the greater the thickness, the better the throwing power.

The plating solutions of this invention are used in conventional manner. They are preferably used at room temperature, but may be used at elevated temperatures up to and somewhat above 150° F. In use, the plating solution is preferably used with solution agitation. This may be accomplished in a variety of ways including an air sparger, work piece agitation or by impingement. Plating is preferably conducted at a current ranging between 1 and 35 amps per square foot (ASF) depending upon the board aspect ratio and thickness.

As discussed above, the solutions of the invention are especially designed for the plating of through-holes in printed circuit manufacture where the through-hole has an aspect ratio greater than 10 to 1 and a length of 0.100 inches, preferably 0.150 inches or more. Prior to deposition of electrolytic copper onto the through-hole wall, the circuit board including the through-hole, is conventionally made conductive by electroless copper deposition. Electroless copper deposition does not constitute a part of this invention. Deposition of copper from the solution of the invention onto the wall of the through-hole results in a deposit that is uniformly thick over the full length of the hole and is characterized by excellent elongation and solder shock properties.

Much of the experimental data given below was obtained using a channel cell electrode. This is believed to be a novel instrument that replicates the plating of a through-hole. This instrument is illustrated in FIGS. 1 and 2 of the drawings.

Figure 2:
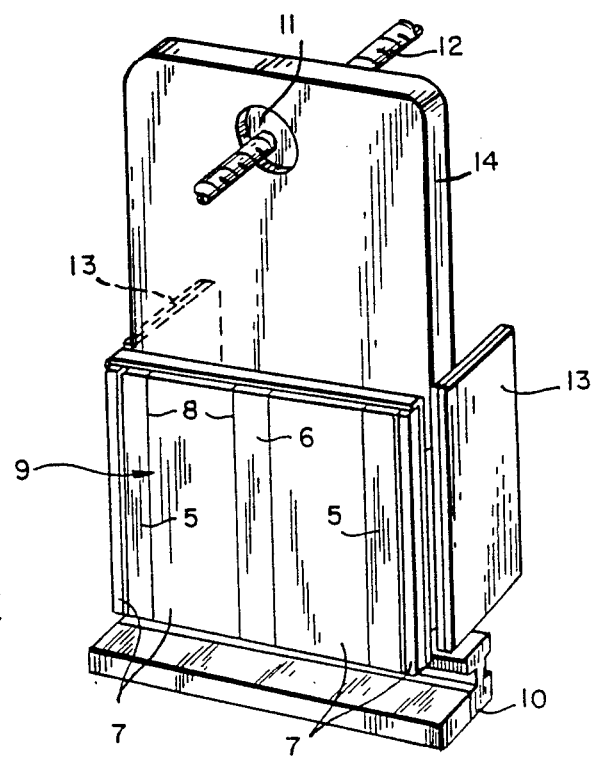
FIG. 2 is a representation of one-half of a channel cell electrode as illustrated in FIG. 1.

In FIG. 1, there is shown plating tank 1 having anodes 2 suspended from bus bars 3 in plating solution 4 within tank 1. The channel cell electrode is used as a cathode 5, also suspended in solution 4. One half of the channel cell electrode is shown in greater detail in FIG. 2. With reference to FIG. 2, the electrode consists of two edge electrodes 5 and center electrode 6 separated by a background electrode 7. Edge electrodes 5 are separated from center electrodes 6 by non-conductive (epoxy) strips 8 and together with the background electrodes make up an electrode assembly 9 that rests above a rectangular thieving strip 10. Thieving 10 prevents the bottom of the cell from plating more than the top of the cell thereby resulting in greater sensitivity in use of the cell. Thieving 10 is provided with hole 11 which permits suspension of electrode 4 in bath 3 by means of rod 12. At right angles to the electrode assembly are placed two surface electrodes 13 in electrical isolation from the electrode assembly comprising edge electrodes 5, center electrode 6 and background electrode 7. Surface electrodes 13 are attached to the non conductive mounting 14 at their edges.

In use, two half channel electrodes are suspended from rod 12 into plating solution 4 contained in tank 1 with the electrode assemblies 9 in face-to-face relationship as illustrated in FIG. 1. The distance between each of the half channel electrodes can be varied while the height of the electrodes is a constant. By moving the half cell electrodes closer or further distant from each other, the ratio of the height of the electrodes to the distance between the electrodes may be varied. This height to distance ratio is analogous to the ratio of the length of a through-hole to its diameter (aspect ratio) and hence, the channel cell electrode can be used to simulate through hole plating at differing aspect ratios. Once the desired simulated aspect ratio is determined, current is passed between the electrodes. The current passing through the edge or surface electrodes and the center electrodes is recorded. The ratio of the current passing through the edge or surface electrodes to the current passing through the center electrode is a measure of solution throwing power for a test solution for a selected aspect ratio.

Figure 3:
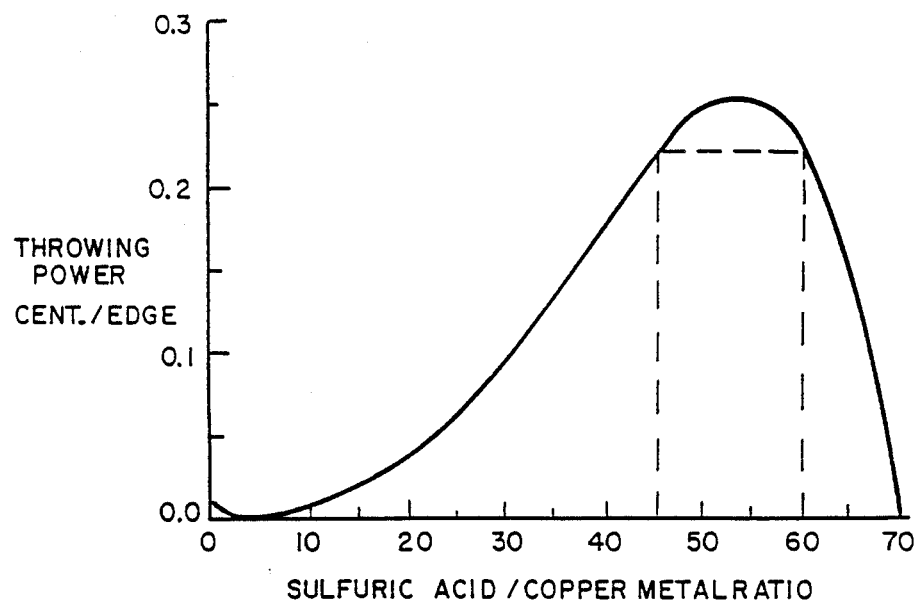
FIG. 3 is a graphical representation of throwing power for a plating solution within a channel cell electrode at various acid to copper ratios.

The throwing power data obtained using the channel cell electrode can be used to predict throwing power for a particular plating solution within a through hole or interconnect as there is a direct correlation between throwing power as measured in the channel cell electrode and throwing power within a circuit board through hole or interconnect. To use the channel cell electrode for this purpose, several test plating solutions would be used for plating within the channel cell electrode. All variables would be standardized except the ratio of acid to copper content in the test solutions. For each test solution, throwing power would be calculated by determining the ratio of the current passing through the edge or surface electrodes and the center electrodes as described above. The results would show a peak for throwing power for a given ratio. An exemplary plot of throwing power versus acid to copper ratio is shown in FIG. 3 of the drawings for a copper plating solution containing 10 grams of copper sulfate pentahydrate per liter of solution. For this test solution, optimum results were obtained at an acid ratio varying between about 45:1 and 60:1. Preferably, a ratio is selected that has a ratio varying from eighty percent of the peak to the peak ratio.

In addition to use of the channel cell electrode to replicate plating within a circuit interconnect or through hole, the channel cell electrode may be used to monitor the performance and relative concentration of acid and copper of a plating solution during its use. To use the channel cell electrode for this purpose, during plating of a printed circuit board, the channel cell electrode would be suspended in the operating plating solution or solution would be continuously passed through the channel cell electrode at a remote location during plating. Current passing through the edge or surface electrodes and the center electrode would be continuously monitored and converted to a ratio depicting throwing power. If during the plating operation, there is variance from a predetermined value for throwing power, for example, as shown in FIG. 3 of the drawings, corrections to the bath composition may be made to return the bath of its optimum operating composition.

The invention will be better understood by the examples that follows.

EXAMPLE 1

This example better illustrates the use of the channel cell electrode depicted in FIGS. 1 and 2 of the drawings. The specific channel cell electrode used had two edge electrodes measuring ½ by 2 inches and a center electrode measuring ¼ by 2 inches. The channel cell electrode was placed in a plating tank measuring 20 by 14 by 5.5 inches (length to height to width) with a total volume of 25 liters. Copper anodes were placed 9 inches from the center of the channel cell electrode. A cam gear was used to permit movement of the channel cell electrode perpendicular to the anodes over a distance of from 1 to 4 inches. This arrangement provided solution agitation.

The plating tank was filled with a plating solution of the following composition:

| | |
|---|---|
| copper sulfate pentahydrate | 10 gm/l |
| sulfuric acid | 150 gm/l |
| chloride | 50 ppm |
| Deionized water | to 1 liter |

The above bath corresponds to one having a hydrogen ion content (expressed as sulfuric acid) to copper metal content of 60 to 1 with a dissolved copper metal (cupric ion) content of 2.5 grams per liter of solution.

Prior to use of the channel cell electrode, it is prepared by polishing with 600 mesh polish. The anodes are prepared by etching with a 30% nitric acid solution until they are of a matte pink coloration. The plating tank is filled with the plating solution and the anodes are immersed into the plating solution to a height whereby the plating solution is 2 inches above the bottom of the anodes. The two halves of the channel cell electrode are spaced ⅜ inches from each other replicating an aspect ratio of in excess of 50:1. Thereafter a current of 6 amps was passed through the cell for test purposes, and the current on the edge electrodes and center electrodes of the channel cell electrode recorded. The ratio of the currents was found to be 0.30. This ratio is defined as throwing power. With sufficient data, the additional ratios can be obtained for the test solution and throwing power graphically depicted for all ratios for the test solution.

EXAMPLES 2 TO 5

The procedure of Example 1 was repeated at three additional levels of dissolved copper, as shown in the following table. Acid concentration was varied for each example to give a series of acid to copper ratios for each test solution.

| | $Cu^{++}$ (gm/l) |
|---|---|
| Example 2 | 15.0 |
| Example 3 | 12.5 |
| Example 4 | 5.0 |
| Example 5 | 2.5 |

For each example, throwing power as defined by the ratio of the current at the edges of the channel cell electrode to the current at the center electrode of the channel cell electrode, was determined for each acid to copper ratio. The results are as shown in the following table:

| | Throwing Power | | | |
|---|---|---|---|---|
| Ratio | Example 2 | Example 3 | Example 4 | Example 5 |
| 5 to 1 | 0.00 | 0.00 | 0.01 | 0.02 |
| 10 to 1 | 0.00 | 0.00 | 0.01 | 0.02 |
| 15 to 1 | 0.00 | 0.01 | 0.02 | 0.03 |
| 20 to 1 | 0.01 | 0.02 | 0.09 | 0.11 |
| 25 to 1 | 0.04 | 0.05 | 0.15 | 0.19 |
| 30 to 1 | 0.03 | 0.10 | 0.19 | 0.24 |
| 35 to 1 | 0.00 | 0.12 | 0.26 | 0.32 |
| 40 to 1 | 0.00 | 0.11 | 0.30 | 0.39 |
| 45 to 1 | 0.00 | 0.06 | 0.32 | 0.42 |
| 50 to 1 | 0.00 | 0.00 | 0.31 | 0.43 |
| 55 to 1 | 0.00 | 0.00 | 0.22 | 0.42 |
| 60 to 1 | 0.00 | 0.00 | 0.14 | 0.41 |

Figure 4:
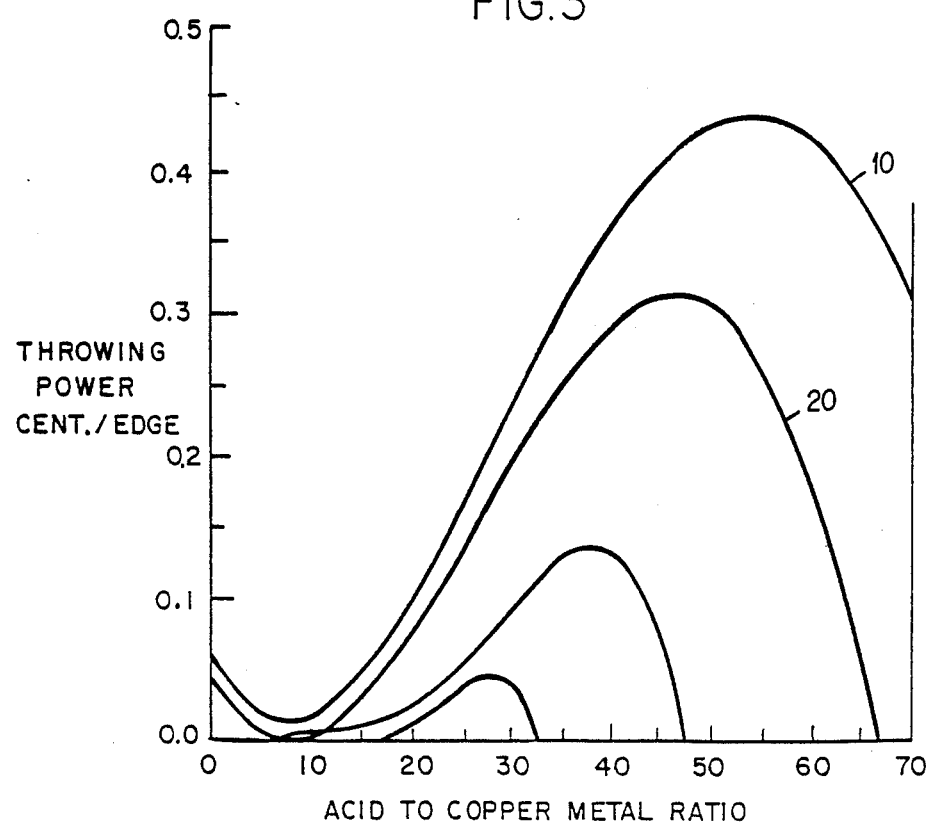
FIG. 4 is a graphical comparison of throwing power of plating solutions within a channel cell electrode at various acid to copper ratios at 6 amps and represents data obtained in Examples 2 through 5 below.

The results of the above examples are graphically represented in FIG. 4 of the drawings. From the graphs, it can be seen that the results obtained for example 2, an example having in excess of 10 grams of copper metal per liter of solution and outside the scope of the invention, are unsatisfactory. The peaks for examples 3 through 5 are at ratios of 35:1, 40:1 and 50:1, respectively showing that the ratio for the peak throwing power increases as the copper metal content decreases.

EXAMPLE 6

The above results may be used to select a preferred plating bath for the manufacture of circuit boards or to monitor bath performance during plating. Using FIG. 4 of the drawings for purposes of illustration, it is predictable that a copper plating bath having a copper metal content of 2.5 grams per liter should exhibit optimum performance when the acid to copper metal ratio varies between about 45:1 and 60:1. For a plating bath with a higher concentration of copper, for example, 5 grams per liter as shown in Example 4 above, optimum throwing power is obtained when the ratio of the acid to copper metal varies between about 35:1 and 55:1. With this information, the plating bath of choice can be formulated from the data obtained and monitored with the channel cell electrode so that the ratio of acid to copper metal does not vary from the preselected ranges.

The above is illustrated by the plating of holes within a circuit board that is an epoxy copper clad circuit board base material that had been metallized by electroless metal deposition. The board contained holes having a 0.013 inch diameter and had a thickness (height) of 0.240 inches or an aspect ratio of 18.5 to 1. The board was electroplated using the plating bath of example 5 with an acid to copper metal ratio of 50:1. All holes were plated with copper of uniform thickness without visible signs of dogboning.

EXAMPLES 7 TO 10

Figure 5:
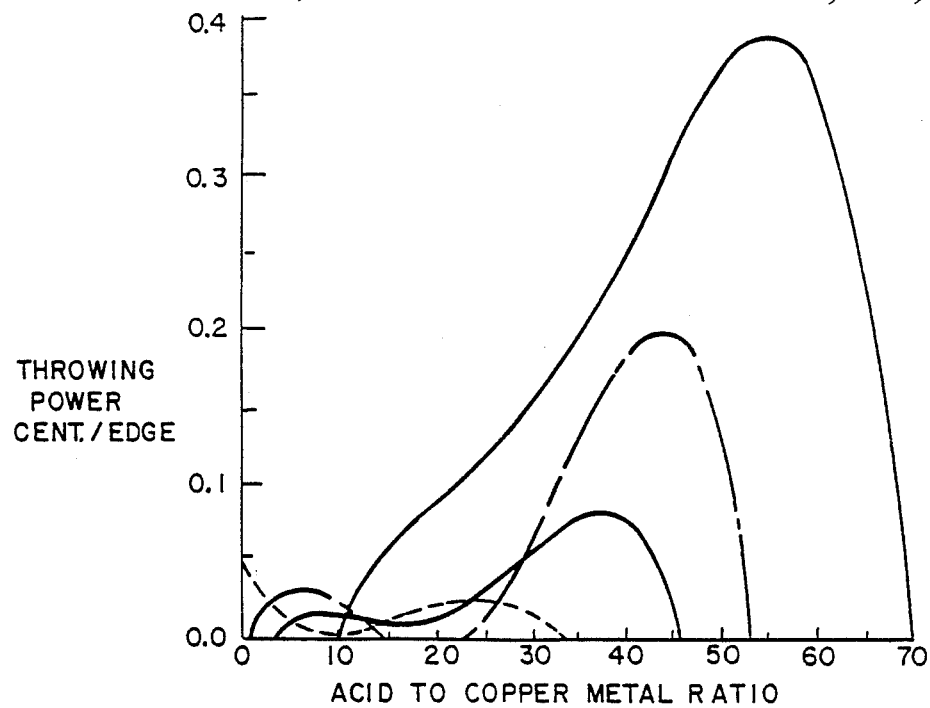
FIG. 5 is a graphical comparison of throwing power of plating solutions within a channel cell electrode at various acid to copper ratios at 3 amps and represents data obtained in Examples 6 through 9 below.

The procedure of Examples 2 through 5 was repeated at 3 amps. The results of this example are graphically represented in FIG. 5 of the drawings. From the graphs, it can be seen that the peak ratios were as follows:

| Example No. | Cupric Content gm/liter | Peak Ratio |
|---|---|---|
| 6 | 15.0 | 25:1 |
| 7 | 10.0 | 37:1 |
| 8 | 5.0 | 45:1 |

-continued

| Example No. | Cupric Content gm/liter | Peak Ratio |
|---|---|---|
| 9 | 2.5 | 50:1 |

The results obtained were consistent with the results given for examples 2 to 5.

EXAMPLE 11

Example 9 was repeated with a polyethylene oxide having a molecular weight of about 1,000,000 and was added to the solution in an amount of 1000 parts per million parts of solution. The results obtained are given in the following table:

| ratio - acid to copper | Throwing Power | |
|---|---|---|
| | with surfactant | without surfactant |
| 5 | 0.00 | 0.03 |
| 10 | 0.02 | 0.00 |
| 15 | 0.05 | 0.00 |
| 20 | 0.10 | 0.00 |
| 25 | 0.20 | 0.00 |
| 30 | 0.28 | 0.04 |
| 35 | 0.35 | 0.15 |
| 40 | 0.40 | 0.19 |
| 45 | 0.44 | 0.20 |
| 50 | 0.40 | 0.12 |

Figure 6:
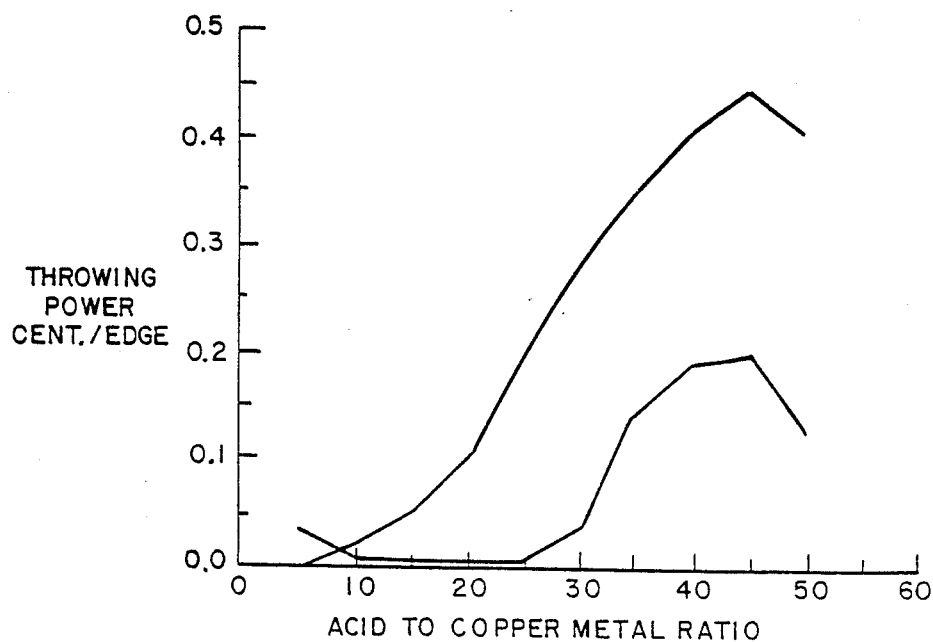
FIG. 6 is a graphical comparison of throwing power of plating solutions within a channel cell electrode at various acid to copper ratios for a solution containing a surfactant and represents data obtained in Example 10 below.

The results are graphically represented in FIG. 6 of the drawings. From the drawing, it can be seen that with the surfactant used, the throwing power was essentially doubled within the desired operating range.

I claim:

1. A device for measuring the throwing power of an electroplating solution, said device comprising two anodes and a cathode suspended in a chamber adapted to contain a plating solution, said cathode being suspended between said anodes and comprising two flat electrode portions in electrical contact with each other, in parallel relationship to each other and spaced apart from each other to define a space adapted to contain plating solution, each of said flat electrode portions having electrode portions electrically isolated from a center electrode, and means for measuring the current on said first electrode portions and center electrode during plating.

2. The device of claim 1 where each flat electrode portion contains two edge electrodes and one center electrode.

3. The device of claim 1 where said flat electrode portions are perpendicular to the anodes.

4. The device of claim 1 where said cathode is centered between said anodes.

5. A method for maximizing throwing power of an electroplating solution, said method comprising the steps of:
   i. placing a sample of a test plating solution having a first acid to metal ratio within a device having two anodes and a cathode suspended into the plating solution, said cathode comprising two flat electrode portions in electrical contact with each other, in parallel relationship to each other and spaced apart from each other to define a space containing said plating solution, each of said flat electrode portions having first electrode portions and a center electrode electrically separated from said first electrode portions;
   ii. plating metal from said test plating solution while measuring the current on said first electrode portions and center electrode during plating and forming a ratio of said currents;
   iii. repeating the process for test plating solutions having differing acid to plating metal ratios and selecting a test solution having a ratio of current densities ranging between eighty percent of the maximum ratio and the maximum ratio; and
   iv. maintaining plating solution within said device during electroplating while periodically adjusting the acid to metal ratio to maintain said selected ratio.

6. The method of claim 5 where the plating solution is a copper plating solution.

7. The method of claim 6 where the dissolved copper content varies from about 1 to 10 grams per liter of solution.

8. The method of claim 5 where the ratio of acid, expressed as sulfuric acid, to copper varies between 30 to 1 and 70 to 1.

9. The method of claim 8 where the ratio varies between 45 to 1 and 60 to 1.

10. The method of claim 5 where the acid is sulfuric acid and the metal is copper.

* * * * *